(12) United States Patent
Uluc et al.

(10) Patent No.: US 7,697,292 B2
(45) Date of Patent: Apr. 13, 2010

(54) AIRCRAFT ELECTRONICS COOLING APPARATUS FOR AN AIRCRAFT HAVING A LIQUID COOLING SYSTEM

(75) Inventors: Ozan Uluc, Hamburg (DE); Ahmet Kayihan Kiryaman, Hamburg (DE); Andreas Frey, Immenstaad (DE)

(73) Assignee: Airbus Deutschland GmbH, Hamburg (DE)

( * ) Notice: Subject to any disclaimer, the term of this patent is extended or adjusted under 35 U.S.C. 154(b) by 169 days.

(21) Appl. No.: 11/850,712

(22) Filed: Sep. 6, 2007

(65) Prior Publication Data

US 2008/0055852 A1 Mar. 6, 2008

(30) Foreign Application Priority Data

Sep. 6, 2006 (DE) .................. 10 2006 041 788

(51) Int. Cl.
H05K 7/20 (2006.01)
F28F 7/00 (2006.01)
F28F 27/00 (2006.01)
F28D 15/00 (2006.01)

(52) U.S. Cl. ............... 361/699; 361/701; 165/80.4; 165/104.34; 165/272

(58) Field of Classification Search ............... 361/696, 361/701
See application file for complete search history.

(56) References Cited

U.S. PATENT DOCUMENTS 4,366,526 A 12/1982 Lijoi et al.
4,635,709 A * 1/1987 Altoz ................ 165/272
4,646,202 A * 2/1987 Hook et al. .............. 361/689
4,819,720 A * 4/1989 Howard .............. 165/104.34
5,285,347 A * 2/1994 Fox et al. ................ 361/699
5,701,755 A * 12/1997 Severson et al. ............ 62/402
5,702,073 A * 12/1997 Fluegel .................... 244/57
6,208,510 B1 * 3/2001 Trudeau et al. ........... 361/696
7,093,458 B2 * 8/2006 Hu .......................... 62/435
2005/0138833 A1 6/2005 Knight et al.
2005/0213306 A1 9/2005 Vos et al.
2007/0236881 A1 * 10/2007 Harder et al. ............ 361/695

FOREIGN PATENT DOCUMENTS

DE 10333353 A1 2/2005
FR 2568712 A1 2/1986
US 2006073553 7/2006

* cited by examiner

Primary Examiner—Gregory D Thompson
(74) Attorney, Agent, or Firm—Wood, Herron & Evans, L.L.P.

(57) ABSTRACT

The invention relates to an improved aircraft electronics cooling system for an aircraft having a liquid cooling system (2), the aircraft electronics cooling system providing a thermal coupling between an electronic device (40a, 40b, 40c, 40d, 42, 44) to be cooled and the liquid cooling system (2) of the aircraft. A coolant delivered by the liquid cooling system (2) may flow through a board of the electronic device (40a, 40b, 40c, 40d), through a heat sink on which the electronic device (42) is arranged and/or through a housing in which the electronic device (44) is arranged. The coolant may be permanently in the liquid state in a cooling circuit. The coolant may vaporize at least partially while cooling the electronic device.

7 Claims, 4 Drawing Sheets

AIRCRAFT ELECTRONICS COOLING APPARATUS FOR AN AIRCRAFT HAVING A LIQUID COOLING SYSTEM

BACKGROUND OF THE INVENTION

Aircraft manufacturers and operators utilize a continuously increasing number of electronic assemblies in aircraft. The electronic assemblies enhance comfort in the cabin on the one hand and aircraft safety on the other. The electronic assemblies generate waste heat and must be cooled in order to function reliably. The air-conditioning apparatus of conventional aircraft are unable, or only partly able, to meet these additional cooling demands.

In conventional, aircraft the electronic devices are so designed that either they must be cooled only by free convection, that is, an air flow is established only through density differences of the air and thus cools the components of the electronic device which are heating up, or additional fans which generate forced convention are provided. Additional cooling capacity for cooling the electronic devices can be made available at present only by an air-conditioning system and with the use of corresponding, weight-increasing conduits.

As previously mentioned, cooling of electronic devices and their components may be effected by means of natural convection. For this purpose the components are designed correspondingly, or fin-like heat sinks, intended to ensure adequate cooling by means of a correspondingly large surface area, are attached thereto. Cooling of the electronic devices and their components is provided either through the already existing air-conditioning system, which is used, for example, for cooling the cabin of the aircraft, or an additional air-conditioning system is provided.

With the aforementioned methods the electronic devices and their components must be so constructed, as early as the design stage thereof, that they withstand the demanding thermal conditions in an aircraft by heat radiation or natural convection. To increase the heat transfer, fans which draw air from the surroundings may be used. With a high cabin temperature, this cooling is frequently insufficient to transport away the heat load generated by the electronic devices. A further disadvantage of these aforementioned methods is that the fan itself generates heat and the mete circulation of the air heats the installation space for the electronic devices, too. The aforementioned methods are unable to cope with larger heat loads of the kind which can be produced by future electronic devices with increased performance.

Cooling of the electronic devices with the aircraft air-conditioning system requires a large amount of space and is insufficiently flexible. The aircraft air-conditioning system has to cool the air provided for cooling the electronic devices. Air supply ducts must be installed in the aircraft from the aircraft air-conditioning system to the electronic devices to be cooled, together with air discharge duds from the electronic devices to be cooled to the aircraft air-conditioning system. Depending on the installation position of the electronics, for example, below the cockpit, if the electronic devices of the aircraft are arranged in that location, the installation of such air supply and discharge ducts can be complex and costly and, furthermore, can require installation space which consequently is not available for other functions. With such long air supply ducts, high thermal and pneumatic losses occur which must be compensated by correspondingly higher performance of the air-conditioning system. This results, inter alia, in the lack of flexibility of these methods. Furthermore, the space conditions prevailing in the aircraft fuselage oppose the use of the aircraft air-conditioning system for cooling the electronic device. In addition, the performance of an aircraft air-conditioning system will be unable to meet the future demands for cooling electronic devices.

DE 103 33 353 A1 discloses a system in which a plurality of electronic devices are cooled with air.

SUMMARY OF THE INVENTION

It is an object of the invention to provide an improved cooling of an electronic device of an aircraft.

This object is achieved by an aircraft electronics cooling apparatus for an aircraft having a liquid cooling system, the aircraft electronics cooling apparatus providing, by means of a coolant circulating in a cooling circuit, a thermal coupling between an electronic device to be cooled and the liquid cooling system of the aircraft which delivers the coolant. The coolant delivered by the liquid cooling system may be permanently in the liquid state in the cooling circuit. However, the aircraft electronics cooling apparatus may also be so configured such that the coolant delivered by the liquid cooling system vaporizes at least partially while cooling the electronic device. In the context of this description a liquid cooling system is a system which delivers a cooled liquid coolant and re-cools a coolant returned from a device to be cooled, in order to deliver it again as a cooled liquid coolant. An electronic device may be a circuit board or a single component, for example, a power transistor.

Liquid cooling systems with which, for example, food containers can be cooled in the galley areas of an aircraft are being increasingly used in aircraft. With such a liquid cooling system, pump devices and cooling devices are arranged in an underfloor area, for example, in the cargo hold, which devices supply heat exchangers installed in the galley areas with coolant via conduits. These heat exchangers then supply the food containers with cold air and provide corresponding cooling for the food.

It is now proposed according to the invention to use such a liquid cooling system for cooling electronic devices in the aircraft. This results in a smaller mass increase of the aircraft, as compared to a conventional cooling system which supplies cold air to the electronic devices to be cooled, although the opposite might be expected by a person skilled in the art. With a liquid-based aircraft electronics cooling apparatus, conduits with a smaller cross-section can be used because far larger quantities of heat can be transported away with a liquid coolant than with a gaseous coolant. The space requirement of the aircraft electronics cooling apparatus is thereby reduced. In addition, the liquid coolant makes possible higher heat transfer coefficients than a gaseous coolant. Because of the smaller cross-section of the coolant conduits, the coolant conduits of a liquid cooling system can be installed in the aircraft in a more flexible way, that is, with fewer restrictions, and sites can be provided with a high cooling capacity which could not be provided with such a high cooling capacity by a conventional air-conditioning system.

The aircraft electronics cooling apparatus may include a heat exchanger of a first type through which flow the coolant of a liquid cooling system and air which is to be cooled by the coolant, the cooled air then being directed on to the electronic device to be cooled. The heat exchanger is arranged in proximity to the electronic device and the cold air delivered by the heat exchanger can move to the electronic device to be cooled through natural convection or with the aid of a fan.

The aircraft electronics cooling apparatus may include a heat exchanger of the first type through which flow the coolant of the liquid cooling system and air which is to be cooled by the coolant, the air to be cooled passing over the electronic device before it enters the heat exchanger of the first type. The air enters the aircraft electronics cooling apparatus, passes the electronic device to be cooled and is cooled in the heat exchanger. In some applications air at the usual cabin air temperature may be sufficient to cool the electronics of an aircraft. Cabin air flows through air inlets to the components, cooling them convectively, for example. The flow of the air over the electronic device may also be supported by a fan and/or forced. The heated air is then cooled to the cabin air temperature by the heat exchanger of the liquid cooling system and returned, to the cabin. This gives rise in the aircraft cabin to a temperature compensation process which does not thermally influence the air-conditioning of the cabin. An advantage of such an aircraft electronics cooling apparatus is that no cold zones, which tend to form condensate, are produced on the electronic device to be cooled or the component to be cooled. Accumulating condensate could cause failure of a component of the electronic device or of the whole electronic device.

The aircraft electronics cooling apparatus may also cool at least one electronic device which is arranged in a housing, the aircraft electronics cooling apparatus including a heat exchanger of a second type arranged in the housing below the at least one electronic device, which heat exchanger of the second type is spaced from the at least one electronic device, and at least one opening respectively for inflow or outflow of air being arranged above the at least one electronic device and below the heat exchanger of the second type. Convective cooling through free convection thereby takes place. Because of the density differences between cold and warm air, the warm air flows out of the top of the housing. The ambient air flows from below through the housing openings, via the heat exchanger of the second type connected to the liquid cooling system, to the at least one electronic device to be cooled and its components.

A fan operated in such a way that it generates an air flow from the heat exchanger of the second type to the at least one electronic device may be arranged, for example, between the heat exchanger of the second type and the at least one electronic device. The cooling capacity of the aircraft cooling system is increased by the air flow generated by the fan.

The electronic device may include a board on which a plurality of electronic components are arranged. The aircraft electronics cooling apparatus may be so configured that the coolant of the liquid cooling system flows through the board. In this case the board itself forms the heat exchanger. The components may be so constructed that they include a heat exchanger through which the coolant flows. In these configurations the heat load can be dissipated directly, that is, without prior transfer of the refrigerating capacity of the liquid cooling system to air.

The electronic device may be arranged in a housing. The aircraft electronics cooling apparatus may be so configured that the housing is at least partially cooled by the coolant of the liquid cooling system. A cooled environment uncoupled from external conditions is thereby created.

The electronic device to be cooled may be arranged on a heat sink, for example by means of its board. The aircraft electronics cooling apparatus may be so configured that the coolant of the liquid cooling system flows through the heat sink. In this configuration the electronic device can be exchanged without the need to open the heat sink. A plurality of electronic devices may be arranged on the heat sink, with their boards, for example. The boards of the electronic devices may be arranged, for example, on the upper, lower or side faces of the heat sink.

The aircraft electronics cooling apparatus may be so configured that the coolant of the liquid cooling system flows around the electronic device. For this purpose the electronic devices are arranged in a sealed and/or isolated housing. The housing is connected to the liquid cooling system via an inlet opening and an outlet opening and can then be flooded with the coolant in operation. This presupposes, however, that the coolant is not affecting the operation of the electronic device or its components. This requirement is met, for example, by a dielectric cooling liquid and/or an electrically non-conductive cooling liquid.

The coolant of the liquid cooling system may flow in a cooling circuit successively and/or in parallel through a plurality of the previously described configurations of the aircraft electronics cooling apparatus. For example, the coolant of the liquid cooling system may flow in the cooling circuit successively and/or in parallel through at least one heat exchanger of the first type, though which flow the coolant of the liquid cooling system and air which is cooled by the coolant, the cooled air being directed onto the electronic device to be cooled. The coolant may additionally flow in the cooling circuit successively and/or in parallel through a heat exchanger of the first type, though which flow the coolant of the liquid cooling system and air which is cooled by the coolant, wherein the air to be cooled entering the aircraft electronics cooling apparatus passes the electronic device to be cooled before entering the heat exchanger of the first type. The coolant may additionally flow in the cooling circuit successively and/or in parallel through at least one board of the electronic device. The coolant may additionally flow in the cooling circuit successively and/or in parallel through at least one heat exchanger of the second type which is arranged in a housing below an at least one electronic device and spaced therefrom, at least one respective opening for inflow or outflow of air being arranged above the at least one electronic device and below the heat exchanger of the second type. In addition, the coolant may flow in the cooling circuit successively and/or in parallel on the outer region of at least one housing in which the electronic device is arranged. The coolant may additionally flow in the cooling circuit successively and/or in parallel through at least one heat sink on which the electronic device to be cooled is arranged, for example, by means of its board. The coolant may also flow in the cooling circuit successively and/or in parallel around at least one electronic device. The coolant can therefore flow in a cooling circuit though the previously described configurations of an aircraft electronics cooling apparatus successively or in parallel in any desired combination.

The invention further provides an aircraft electronics cooling apparatus for an aircraft having a liquid cooling system, the aircraft electronics cooling apparatus being so configured that the coolant cools successively and/or in parallel though a plurality of electronic devices and the coolant is permanently in the liquid state. The refrigerating source of the liquid cooling system may be remote from the electronic devices. Two liquid cooling systems may be present in the aircraft. One of the liquid cooling systems cools a first number of electronic devices. The other liquid cooling system cools a second number of electronic devices. The first number of electronic devices is redundant with respect to the second number of electronic devices. This aircraft electronics cooling apparatus may utilize the previously described heat exchangers or one of the previously described thermal couplings between the electronic device to be cooled and the coolant.

The invention further relates to a method for cooling an electronic device in an aircraft having a liquid cooling system, the method including the step of thermally coupling the liquid cooling system delivering a coolant to the electronic device by means of a cooling circuit. The coolant delivered by the liquid cooling system may be permanently in the liquid state in the cooling circuit. The coolant delivered by the liquid cooling system may vaporize at least partially while cooling the electronic device. The method may be further configured as previously described.

The invention further relates to the use of a liquid cooling system of an aircraft delivering a coolant for cooling an electronic device in an aircraft by means of a coolant circuit. The coolant delivered by the liquid cooling system may be permanently in the liquid state in the cooling circuit. It is to be understood that the coolant delivered by the liquid cooling system may vaporize at least partially while cooling the electronic device. These aspects of the invention may be further configured as described previously.

The inventive liquid cooling system provides additional cooling capacity for the electronic devices in an aircraft. Especially when high demands are placed on the cooling system by the cabin, the liquid cooling system can ensure sufficient cooling of the electronic devices. Moreover, the liquid cooling system can cover a relatively wide temperature range and provide cooling for relatively large thermal loads. Through the use of the liquid cooling system for cooling electronic devices, efficient cooling of the electronic devices is ensured in combination with reduced weight. In case a liquid cooling system already exists, practically every region of the aircraft can be reached in a space-saving and flexible way. Because the temperature level of a liquid cooling system is usually lower than is required for cooling an electronic device, the return flow from other heat exchangers, for example, a heat exchanger in the onboard galley, may also be used for cooling said electronic device.

BRIEF DESCRIPTION OF TILE DRAWINGS

The invention will now be explained in more detail with reference to the appended schematic Figures, in which.

DETAILED DESCRIPTION

Figure 1:
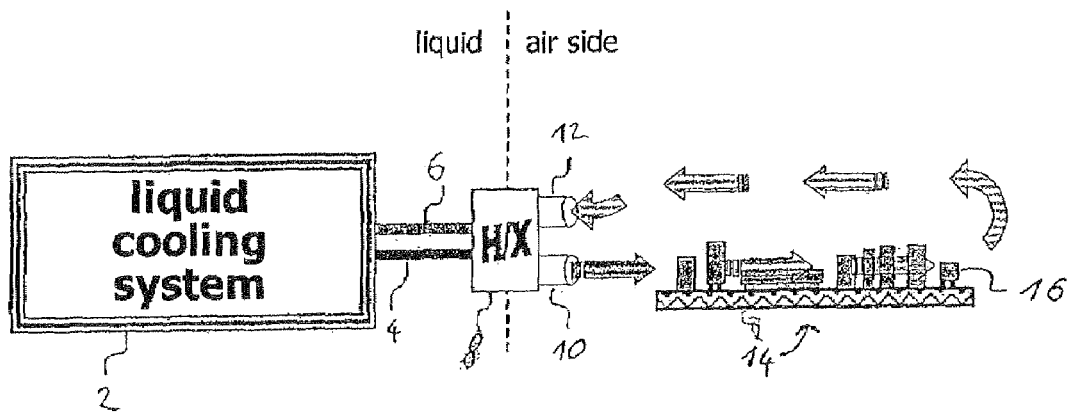
FIG. 1 shows a first embodiment of the invention, in which alt cooled by means of a liquid cooling system is directed on to an electronic device.

FIG. 1 shows a liquid cooling system 2 which supplies coolant to a heat exchanger 8 via a feed line 4, which coolant is returned from the heat exchanger 8 to the liquid cooling system 2 via a return line 6. The liquid cooling system 2 cools the coolant and delivers it again. In the resulting cooling circuit the coolant is permanently in the liquid state. It is to be understood that in a different embodiment the coolant may vaporize at least partially in the heat exchanger 8. The heat exchanger 8 draws in warm air via an intake conduit 12, which warm air is cooled as it passes through the heat exchanger 8, and is directed by a discharge conduit 10 on to an electronic device 14 with a plurality of components. In this embodiment the electronic device 14 and its components 16 are cooled convectively. The heat exchanger 8 is located in proximity to the electronic device 14, 50 that only a short intake conduit 12 and discharge conduit 10 are required. The air exiting the heat exchanger 8 may cool a plurality of electronic devices 14.

Figure 2:
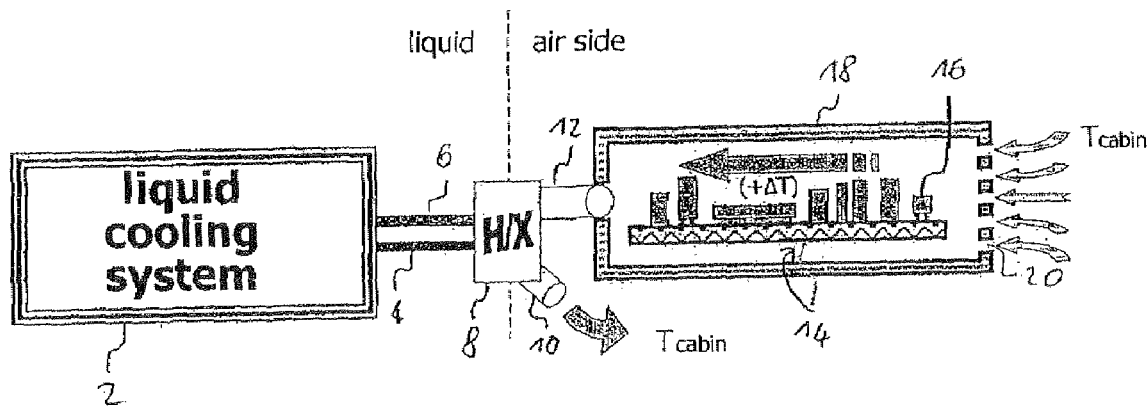
FIG. 2 shows a second embodiment of the invention, in which air flows over an electronic device and is then cooled by a liquid cooling system.

FIG. 2 shows a further embodiment of the aircraft electronics cooling apparatus. A liquid cooling system 2 supplies coolant to a heat exchanger 8 via a feed line 4, which coolant is returned to the liquid cooling system 2 via a return line 6. Air from the cabin at cabin air temperature enters a housing 18 via at least one opening 20 in the housing 18, in which an electronic device 14 with a plurality of electronic components 16 is arranged. The air flows past the components 16 of the electronic device 14, cooling the components 16 and the whole electronic device 14. The air flowing past the electronic device 14 enters the heat exchanger via an intake conduit 12, is cooled in the heat exchanger to the cabin air temperature and re-enters the cabin via a discharge conduit 10. In some applications the usual cabin air temperature in an aircraft is sufficient to cool an electronic device. In this embodiment a neutral temperature compensation process which does not thermally influence the cabin air-conditioning system is produced for the aircraft cabin. An advantage of this embodiment is that no cold zones, on which condensate can collect, are produced on the electronic device 14 mid/or on its components 16. Condensate can cause failure of a component 16 or of the electronic device 14. The air entering the heat exchanger 8 may cool a plurality of electronic devices 14.

Figure 3:
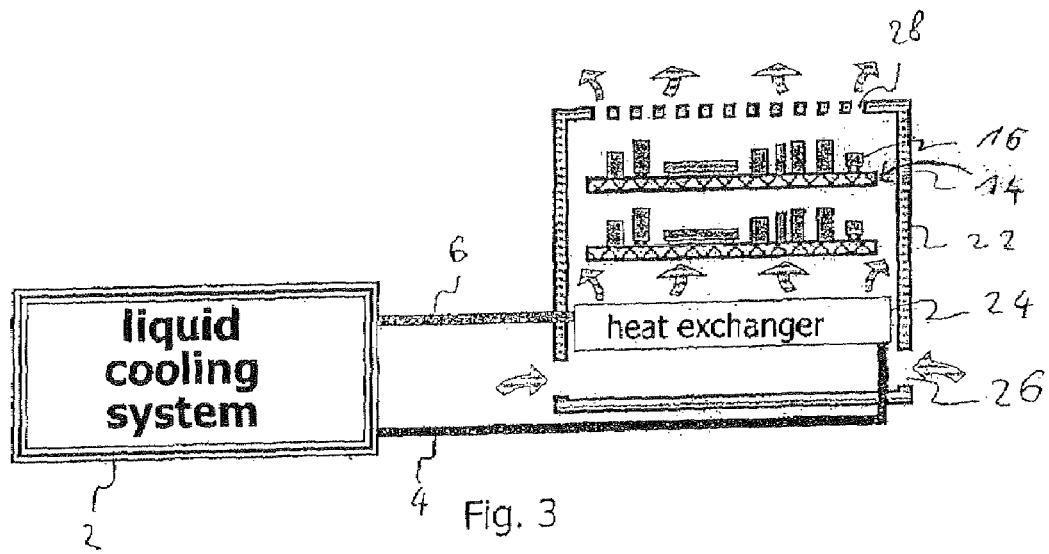
FIG. 3 shows a third embodiment of the invention, in which coolant is supplied by a liquid cooling system to a heat exchanger in a housing with a plurality of electronic devices arranged one above the other.

FIG. 3 shows a third embodiment of the inventive aircraft electronics cooling apparatus. A plurality of electronic devices 14 with a plurality of electronic components 16 are arranged in a housing 22. At least one lower opening 26 is located in the lower region of the housing 22 and at least one upper opening 28 is located in the upper region of the housing 22. A heat exchanger 24 is arranged between the at least one lower opening 26 and the plurality of electronic devices 14. A liquid cooling system 2 supplies coolant to the heat exchanger 24 via a feed line 4, which coolant is returned to the liquid cooling system 2 via a return line 6. In this embodiment cooling takes place by free convection. The warm air with low density exits the housing 22 through the plurality of upper openings 28. At the same time air enters though the plurality of lower openings 26 of the housing 22, is cooled by the heat exchanger 24 and flows to the electronic devices 14 and their components 16 to be cooled.

Figure 4:
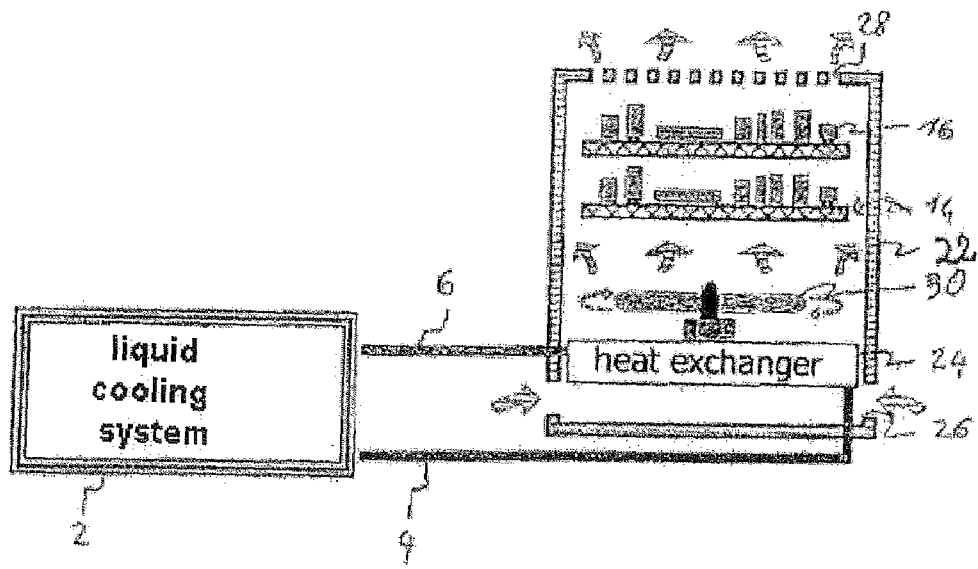
FIG. 4 shows a fourth embodiment of the invention similar to the third embodiment, in which a fan is arranged in the housing above the heat exchanger.

FIG. 4 shows a fourth embodiment of the inventive aircraft air-conditioning system which is similar to the embodiment of FIG. 3 and additionally includes a fan 30 which is arranged in the housing 22 between the heat exchanger 24 and the plurality of electronic devices 14 with a plurality of components 14. The fan 30 generates an air flow which is directed towards the electronic devices 14 to be cooled. Air enters the housing via the plurality of lower openings 26, passes through the heat exchanger 24 and flows around the electronic devices 14 and their components 16 in order to cool same, and exits the housing 22 through the upper openings 28.

Figure 5:
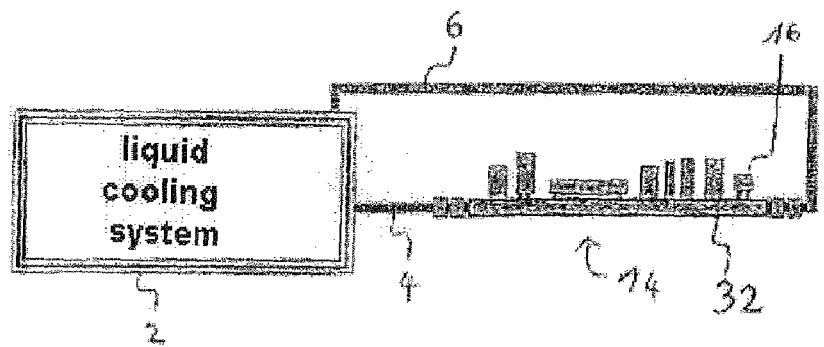
FIG. 5 shows a fifth embodiment of the invention, in which coolant flows through a board of an electronic device.

FIG. 5 shows a fifth embodiment of the inventive aircraft electronics cooling apparatus. An electronic device 14 comprises a plurality of components 16 which are arranged on a board 32. The board 32 is in the form of a heat exchanger and coolant flows at least partially through said heat exchanger. A liquid cooling system 2 supplies coolant to the board 32 via a feed line 4, which coolant cools the components 16 arranged on the board 32. The coolant may also flow through at least one component 16 which is arranged on the board 32. The coolant exits the board into a return line 6 and is returned to the liquid cooling system 2.

Figure 6:
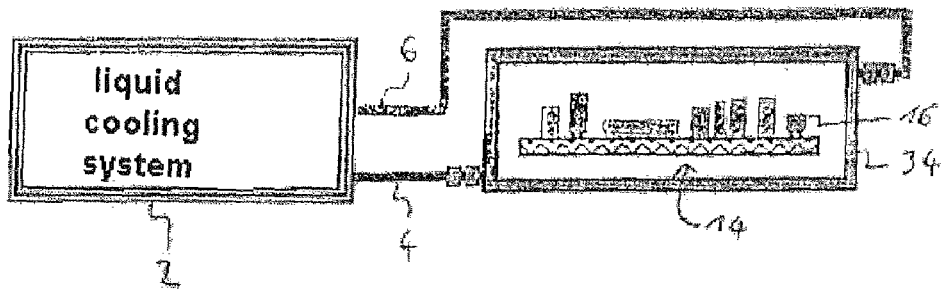
FIG. 6 shows a sixth embodiment of the invention, in which coolant flows in the outer region of a housing in which an electronic device is arranged.

FIG. 6 shows a sixth embodiment of the inventive aircraft electronics cooling assembly, in which an electronic device with a plurality of components 16 is arranged in a housing 34. Coolant flows at least partially through the outer region of the housing 34, or at least a housing wall. A liquid cooling system 2 supplies coolant via a feed line 4 to the housing 34. The housing and also the electronic device 14 in the housing are thereby cooled. The coolant exits the housing 34 into a return line 6 and is returned to the liquid cooling system. In this embodiment the electronic device 14 is completely uncoupled from the environment. This embodiment may be used with electronic devices which must ensure especially high security against failure and/or which control or monitor safety-relevant functions.

Figure 7:
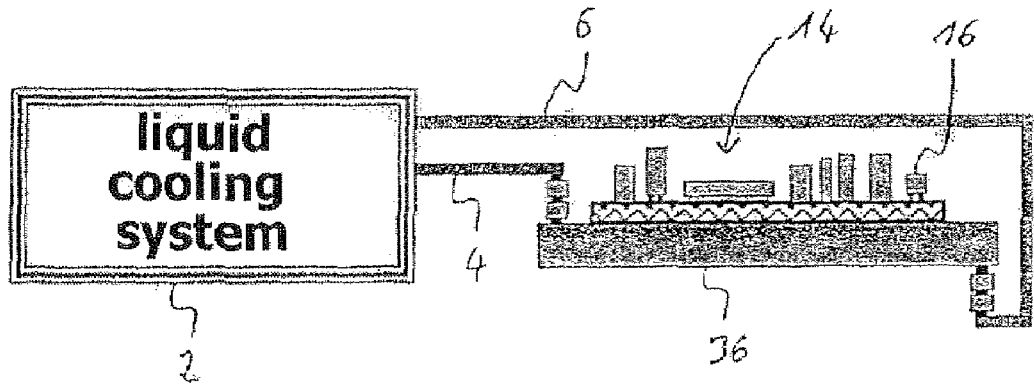
FIG. 7 shows a seventh embodiment of the invention, in which the electronic device is arranged on a heat sink though which coolant flows.
Figure 8:
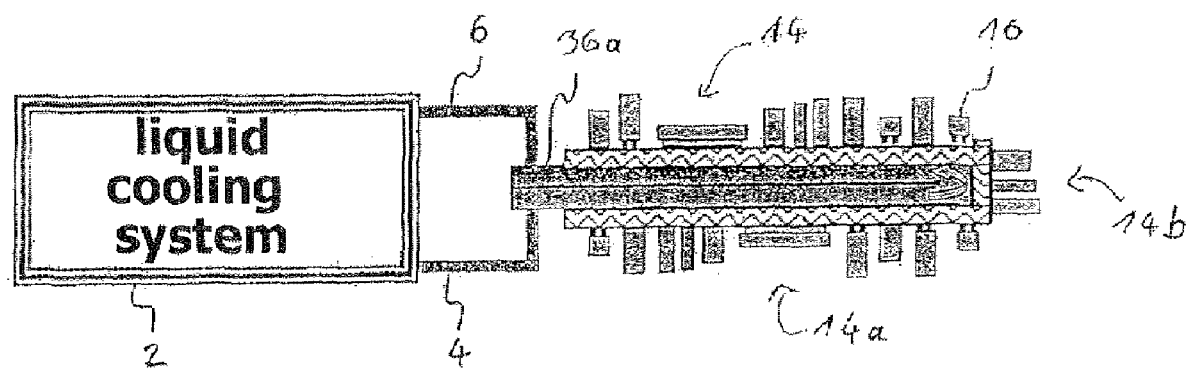
FIG. 8 shows an eighth embodiment of the invention similar to the seventh embodiment, in which a plurality of electronic devices are arranged on the heat sink.

FIG. 7 shows a seventh embodiment of the invention, in which an electronic device 14 is arranged on a heat sink 36, e.g. a cooling body. FIG. 8 shows an eighth embodiment of the invention, in which a plurality of electronic devices 14, 14a, 14b are arranged on a heat sink 36a. A liquid cooling system 2 supplies coolant via a feed line 4 to the heat sink 36, 36a, on which at least one electronic device 14, 14a, 14b is arranged. The heat sink extracts heat from the at least one electronic device 14, 14, 14b and dissipates it to the coolant. The coolant flows back to the liquid cooling system 2 via a return line 6. These embodiments have the advantage that it is not necessary to open the cooling circuit in order to exchange the electronic device 14, 14a, 14b. This gives rise to an aircraft electronics cooling apparatus which is especially maintenance-friendly. However, it is not ruled out in these embodiments that individual components 16 are supplied with coolant separately.

Figure 9:
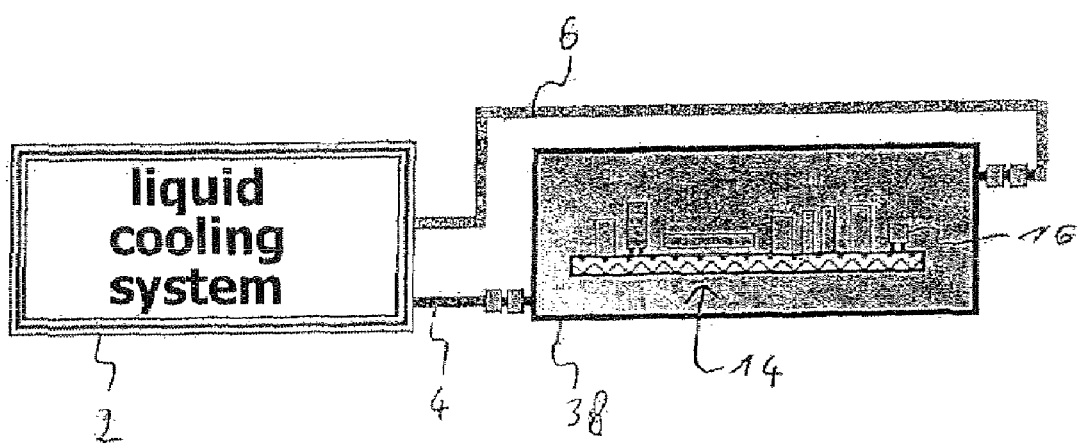
FIG. 9 shows a ninth embodiment of the invention, in which coolant flows around an electronic device.

FIG. 9 shows a ninth embodiment of the inventive aircraft electronics cooling apparatus, in which an electronic device is arranged in a housing 38, the coolant flowing through the interior of the housing 38. A liquid cooling system 2 supplies coolant to the housing 38 via a feed line 4. In the interior of the housing 38 the coolant flows around the electronic device and its components 16. However, the electronic device 14 may also be scaled, so that the components 16 do not come into contact with the coolant. The coolant extracts heat from the electronic device 14 and its components 16, respectively, and flows back to the liquid cooling system 2 via a return line 6. In this embodiment an especially large amount of heat is extracted from the electronic device 14 and its components 16, so that this embodiment is especially suitable for electronic devices which must provide high electronic performance or have high power dissipation. In this embodiment the electronic device must be so constructed that the coolant has no influence on the operability of the electronic device. This requirement is met, for example, by a dielectric cooling liquid and/or an electrically non-conductive cooling liquid.

Figure 10:
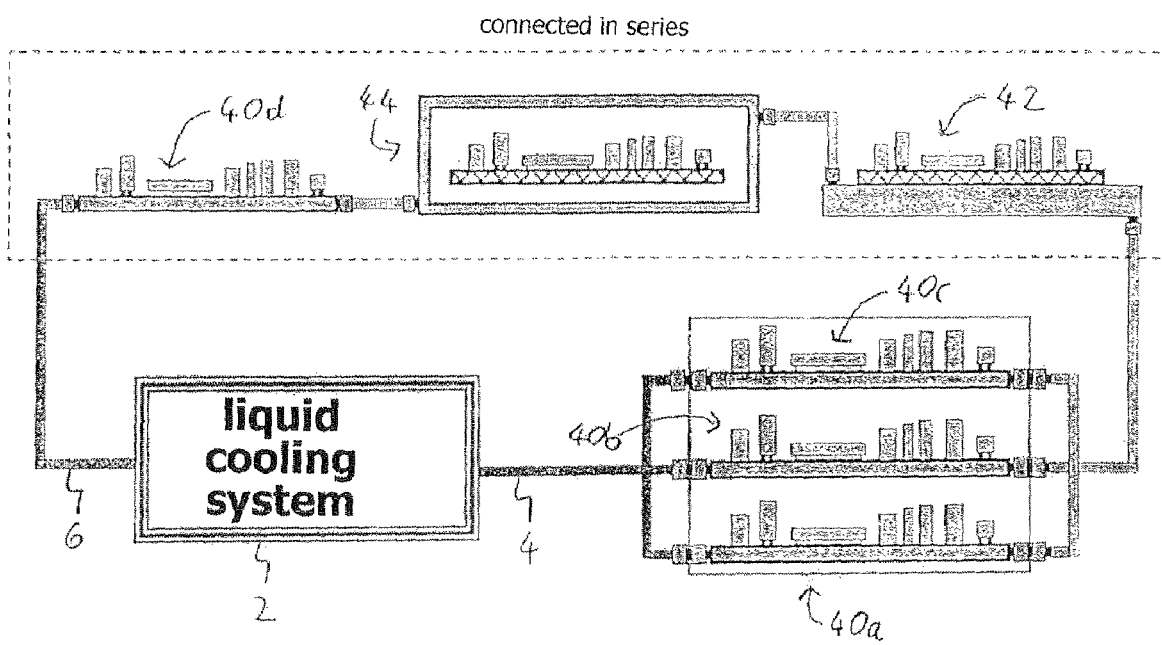
FIG. 10 shows a tenth embodiment of the invention, in which a plurality of electronic devices are cooled successively or in parallel in a cooling circuit.

FIG. 10 shows an inventive aircraft electronics cooling apparatus in which the coolant provides cooling in series and in parallel to a plurality of electronic devices in a cooling circuit. Via a feed line 4 a liquid cooling system 2 supplies coolant in parallel to a plurality of electronic devices 40a, 40b, 40c, through the boards of which coolant flows, as explained previously with reference to the fifth embodiment. The coolant flows through the plurality of electronic devices 40a, 40b, 40c in parallel, ensuring higher redundancy and security against failure. The coolant also flows to an electronic device 42 which is arranged on a heat sink through which coolant flows, as explained previously with reference to the seventh embodiment. The coolant then flows into the outer region of a housing in which an electronic device 44 is located, as explained previously with reference to the sixth embodiment. The coolant then flows to a further electronic device 40d which is so configured that the coolant can flow through the board thereof in order to cool the electronic device 40d, as explained previously with reference to the fifth embodiment. The coolant then flows back to the liquid cooling system 2 via a return line 6. The electronic devices 42, 44, 40d connected in series to one another may be located at different sites in the aircraft. Because of the high flexibility of the inventive aircraft electronics cooling apparatus, electronic devices which are located at practically any desired site in the aircraft can be cooled. It is to be understood that, in order to increase the safety and redundancy of the inventive aircraft electronics cooling apparatus, all the electronic devices may also be supplied with coolant in parallel.

The coolant utilized in the aircraft electronics cooling apparatus is preferably a dielectric liquid. The dielectric liquid does not affect the operation of the electronic devices and their components. The coolant preferably has a temperature from approximately +10.degree. C. to approximately +20.degree. C. An example of a dielectric liquid is Galden.® HT 135 or ZT 130 of Solvay Solexis.

In an embodiment the coolant delivered by the liquid cooling system may be permanently in the liquid state. In this embodiment thermodynamic parameters such as boiling temperature and the like do not need to be considered. Moreover, in this embodiment, as explained previously, a plurality of electronic devices to be cooled may be located serially in a cooling circuit.

In another embodiment, however, the aircraft electronics cooling apparatus may be so configured that the coolant delivered by the liquid cooling system vaporizes at least partially while cooling the electronic device. With this embodiment higher cooling capacities can be achieved and larger quantities of heat transported away.

We claim:

1. Aircraft electronics cooling apparatus for an aircraft comprising:
   a liquid cooling system onboard the aircraft, the liquid cooling system including a coolant circulating in a cooling conduit, and
   a heat exchanger though which flows the coolant in the cooling conduit and also air that is cooled therein by the coolant, wherein the air entering the heat exchanger is passed from a cabin of the aircraft to the electronic device to be cooled and then to the heat exchanger, and the air exiting the heat exchanger is directed back to the cabin.

2. Aircraft electronics cooling apparatus according to claim 1, wherein the coolant delivered by the liquid cooling system is permanently in the liquid state in the cooling conduit.

3. Aircraft electronics cooling apparatus according to claim 1, wherein the coolant delivered by the liquid cooling system vaporizes at least partially in the heat exchanger.

4. Aircraft electronics cooling apparatus according to claim 1, wherein the coolant delivered by the liquid cooling system is a dielectric liquid or an electrically non-conductive liquid.

5. A method for cooling an electronic device in an aircraft having a cabin, a liquid cooling system, and a heat exchanger, the method comprising:
 directing air flow from the cabin over an electronic device to cool the electronic device;
 delivering warm air from the electronic device to the heat exchanger;
 cooling the warm air in the heat exchanger with liquid coolant from the liquid cooling system; and
 directing cooled air from the heat exchanger back to the cabin.

6. The method of claim 5, wherein the cooling the warm air further comprises:
 maintaining the liquid coolant in the liquid state in the heat exchanger.

7. The method of claim 5, wherein the cooling the warm air further comprises:
 vaporizing the liquid coolant in the heat exchanger.

* * * * *